United States Patent [19]
Hawks

[11] Patent Number: 5,239,264
[45] Date of Patent: Aug. 24, 1993

[54] ZERO-OFFSET MAGNETOMETER HAVING COIL AND CORE SENSOR CONTROLLING PERIOD OF AN OSCILLATOR CIRCUIT

[75] Inventor: Timothy J. Hawks, Palo Alto, Calif.

[73] Assignee: Precision Navigation, Inc., Mountain View, Calif.

[21] Appl. No.: 792,009

[22] Filed: Nov. 14, 1991

[51] Int. Cl.$^5$ ............................................. G01R 33/04
[52] U.S. Cl. ........................................ 324/253; 331/65
[58] Field of Search ........ 324/244, 247, 249, 252–256, 324/260; 331/65

[56] References Cited

U.S. PATENT DOCUMENTS

| | | | |
|---|---|---|---|
| 3,461,382 | 8/1969 | Anderson | 324/253 |
| 4,728,888 | 3/1988 | Bauer et al. | 324/253 |
| 4,733,181 | 3/1988 | Bauer | 324/253 |
| 4,851,775 | 7/1989 | Kim et al. | 324/247 |
| 5,039,945 | 8/1991 | Webb | 324/253 |

FOREIGN PATENT DOCUMENTS

0045509 2/1982 Fed. Rep. of Germany .

*Primary Examiner*—Gerard R. Strecker
*Assistant Examiner*—Warren S. Edmonds

[57] ABSTRACT

A magnetometer technology is provided based on a simple axial sensor which operates using the non-linear nature of saturating magnetic core material. The sensor appears electrically as an inductor with a non-linear inductance that varies both with magnetic field applied externally and the field created by the coil current. By using this sensor as the inductor of an LR relaxation oscillator, a change in applied magnetic field will cause a change in inductance, which will in turn cause a change in the oscillator period. The period of the oscillator can be converted to a digital form by using simple counting techniques. By introducing an enhancement of this scheme whereby two different periods are measured with different oscillator characteristics, the magnetometer will have no output drift when no field is applied.

10 Claims, 9 Drawing Sheets

ZERO-OFFSET MAGNETOMETER HAVING COIL AND CORE SENSOR CONTROLLING PERIOD OF AN OSCILLATOR CIRCUIT

FIELD OF THE INVENTION

This invention is in the field of magnetometers, and is particularly concerned with digital circuitry therefor which is insensitive to temperature variations and variations which occur in the process of mass manufacturing and which normally occur with age.

BACKGROUND OF THE INVENTION

A variety of digital magnetometers are known in the art. For example, U.S. Pat. No. 3,396,329 issued Aug. 6, 1968 to Salvi, discloses a magnetometer in which the intensity of weak magnetic fields is a function of frequency differences in sensed signals, but independent of orientation of a vessel in which the magnetometer is installed. U.S. Pat. No. 3,634,946 issued Jan. 18, 1972 to Star, relates to an all digital circuit implementation of a digital compass which operates on the basis of spatial relationships of pulses produced when a sensor is aligned in a reference direction and orthogonal to the Earth's magnetic field. U.S. Pat. No. 4,305,034, issued Dec. 8, 1981 to Long et al., disclosed a magnetometer in which frequency changes are created when a background magnetic field is perturbed by a metal object. This device, however, cannot provide sign information, i.e. whether the field is parallel or antiparallel to the sensor coil. U.S. Pat. No. 4,340,861, issued July 20, 1982 to Bondarevsk et al., discloses that a strong magnetic field will produce frequency differences in an LC circuit.

U.S. Pat. No. 4,851,775, issued Jul. 25, 1989, assigned to Precision Navigation, Incorporated of Mountain View, Calif., incorporated herein by reference, discloses a digital compass and magnetometer having a sensor coil wound on a high magnetic permeability isotropic core. This patent is closely related to the present invention in that the response of the sensor coil to an external magnetic field in conjunction with a resistive element controls the frequency of a relaxation oscillator. In this patent the oscillator driver is a Schmitt-trigger, the output of which provides a signal related to the magnitude of the external magnetic field. This implementation however, suffered from problems with zero offset. The magnetometer zero-offset would drift significantly with temperature and with age.

Another approach that deals specifically with the zero-offset problem is described in European Patent Application A3 0045509 filed Aug. 3, 1981. In that application, the magnetic sensor is an iron core with a winding which determines the frequency of the oscillator. A square wave is laid onto the excitation winding of the magnetic sensor. The detection winding of the magnetic sensor is the inductance of the oscillator which is an LC oscillator. An alternating magnetic bias of the iron core is attained with the square wave voltage. The inductance of the detection winding of the magnetic sensor is dependant upon the magnetic bias. An external magnetic field causes a change in the magnetic bias and thereby a change in the inductance, through which the frequency of the oscillator is raised at one time and lowered at another time. The respective frequencies are ascertained and out of it the difference formed. Thereby, the zero value of the frequency is eliminated, so that the precision of the measurement rises because the variations due to temperature and age of the iron core have been ameliorated. The problem with this approach, however, is that the circuits and their implementation are quite complicated. Furthermore, this system has startup difficulties due to the non-linear inductive sensor.

What is needed is an approach which uses the inherent simplicity of a relaxation oscillator as the principal tool to measure magnetic fields and still achieves the zero offset result, independent of temperature and age.

SUMMARY OF THE INVENTION

In accordance with preferred embodiments of the invention, a magnetometer technology is provided based on a simple axial sensor which operates using the non-linear nature of saturating magnetic core material. In the preferred mode, the sensor consists of a solenoidal-geometry coil wrapped around a saturable, high-permeability magnetic core (such as an amorphous metal.) The sensor appears electrically as an inductor with a non-linear inductance that varies both with magnetic field applied externally and the field created by the coil current. By using this sensor as the inductor of an L/R relaxation oscillator, a change in applied magnetic field will cause a change in inductance, which will in turn cause a change in the oscillator period. The period of the oscillator can be converted to a digital form by using simple counting techniques. By introducing an enhancement of this scheme whereby two different periods are measured with different oscillator characteristics, the magnetometer will have no output drift when no field is applied.

More specifically, in the preferred mode, the magnetometer is made up of a relaxation oscillator circuit having a Schmitt-trigger driver with an output terminal for providing an oscillating signal. The circuit includes a sensor having a first coil wound on a first high magnetic permeability core for controlling the period of the oscillator circuit, the first coil having first and second first-coil terminals, and the first coil being electrically symmetric between the first and second first-coil terminals. A first first-coil resistor is coupled to the first first-coil terminal. A second first-coil resistor is coupled to the second first-coil terminal, with second first-coil resistor and first first-coil resistor being impedance matched. A switching element is coupled to the first and second first-coil terminals and to the input terminal of the Schmitt-trigger driver for coupling the input terminal alternately to the first first-coil terminal and to the second first-coil terminal. A gating element coupled to the first first-coil resistor and to the second first-coil resistor is used for shunting the first first-coil resistor to ground when the switching element couples the input terminal of the Schmitt-trigger driver to the second first-coil terminal, and for shunting the second first-coil resistor to ground when the switching element couples the input terminal of the Schmitt-trigger driver to the first first-coil terminal. The circuit also includes a measurement element for analyzing the output signal from the output terminal of the Schmitt-trigger element, and for providing a signal representing the magnitude of the external magnetic field strength.

By using additional wire-wound cores on different axes, with the corresponding resistors, the external field on all three axes may be determined.

In accordance with another preferred embodiment of the invention, a magnetometer is provided which uses different relaxation oscillator circuit. In this embodiment, the oscillator is made up of a Schmitt-trigger element having an input terminal and an output terminal for providing an oscillating signal at said output terminal, the Schmitt-trigger element having symmetrical thresholds. The oscillator also includes a sensor having a first coil wound on a first high magnetic permeability core for controlling the period of said oscillator circuit. The sensor is coupled between the input terminal and the output terminal of Schmitt-trigger. The circuit also includes a timing resistance coupled to said input terminal of said driver means, and a bias polarity switching element coupled to said timing resistance means opposite the input terminal of the Schmitt-trigger means. The bias polarity switching element is used for switching the bias polarity of said Schmitt-trigger means. The measurement element of the magnetometer for analyzing the output signal from this magnetometer circuit can be the same as for the previous embodiment.

Further, it should be understood that this circuit in a practical application for obtaining three axes of information would be implemented with three inductive sensors. Generally, each sensor is activated separately, and the measurement made, then the three-axis information is combined to obtain both a magnitude and direction for the magnetic field being measured.

DESCRIPTION OF THE PREFERRED EMBODIMENTS

Zero-Offset Magnetometer

Figure 1:
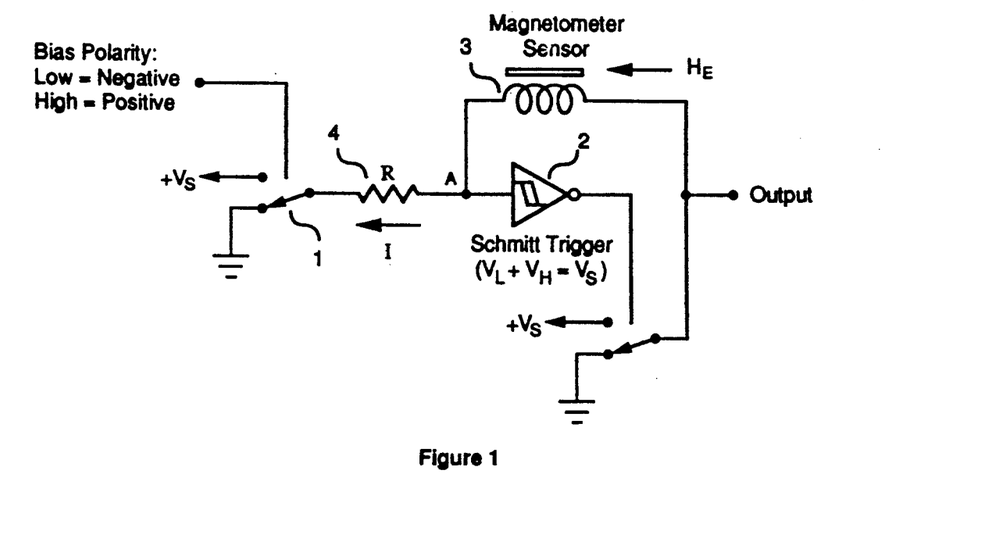
FIG. 1 is a schematic of a basic uniaxial magnetometer according to a first embodiment of the invention.

Shown in FIG. 1 is a basic uniaxial magnetometer according to a preferred embodiment of the invention. The magnetometer has a Schmitt-trigger 2 as the driver in an L/R relaxation oscillator and a magnetometer sensor 3 consisting of a wire-wound high magnetic permeability core as an inductive element. In the preferred mode, the sensor core is constructed of Metglas 2705M available from Allied Signal, and has dimensions of $0.020'' \times 0.600'' \times 0.001''$. Typically, the core is wound with about 2000 turns of 41 gauge AWG wire.

Figure 3:
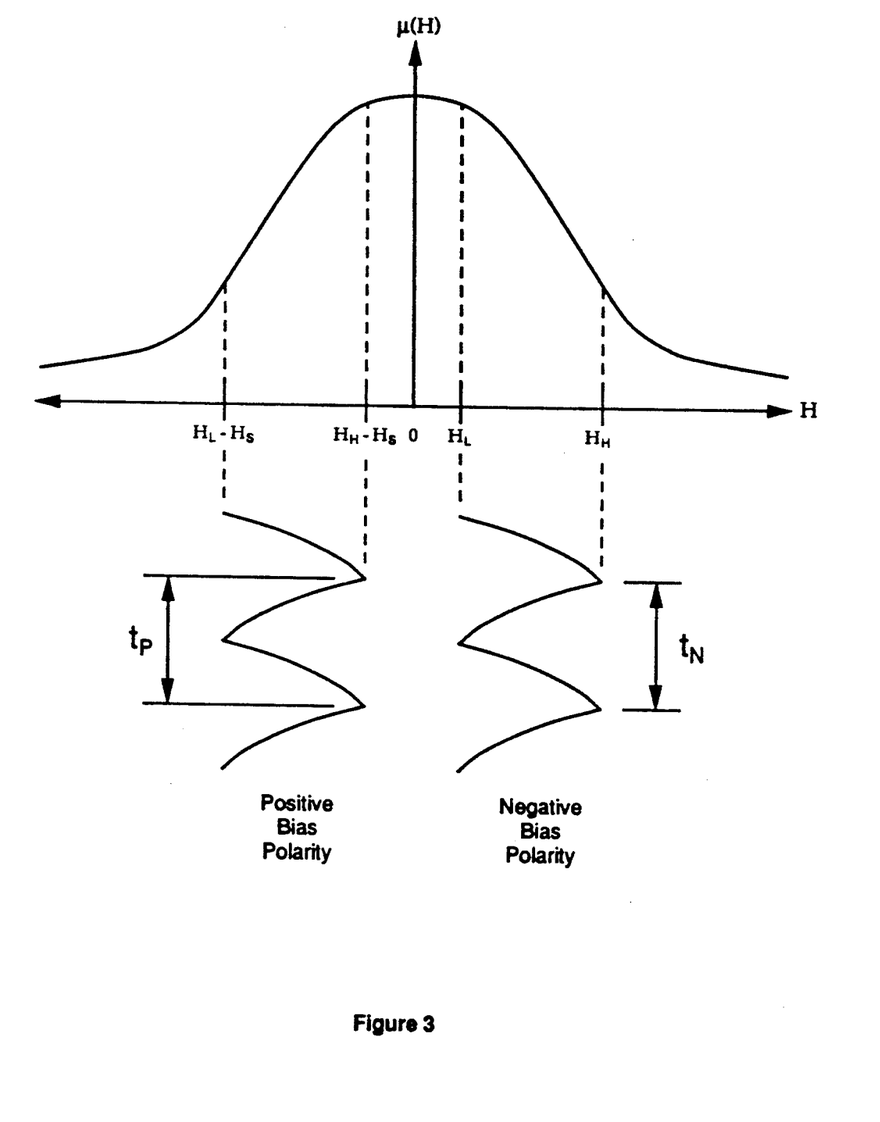
FIG. 3 shows waveforms associated with operating the magnetometer sensor of FIG. 1 with no applied external magnetic field.

The total magnetic field through the magnetic core material is the sum of the external magnetic field and the field created by current flowing through the inductive element. That relationship is expressed by equation (1) below.

$$H = k_0 I + H_E \quad (1)$$

where H is the total magnetic field through the core material, $H_E$ is the external applied magnetic field that is parallel to the core material, and I is the current flowing through the inductor coil. Constant $k_0$ is dependent on a few different physical parameters such as the turn density of the coil. (Equation (1) assumes that the applied field $H_E$ is in the same direction as the field produced by a positive current I.) When a high-permeability material experiences a magnetic field, it effectively amplifies this field by a large factor known as the permeability. For many materials this can be anywhere from 100 to 100,000 at the maximum point. Typically, the permeability is high for only a limited range of small fields. As the field applied to the material is increased in either direction, the permeability of the material drops off to a gain of one. This reflects the saturating characteristic of these materials. The permeability as a function of the applied field is denoted as u(H). A graph of a sample permeability function is shown as part of FIG. 3 below. The voltage across the sensor coil will be a function of the change in the resulting magnetic field from the material. This can be expressed as follows:

$$V = k_1 u(H) \cdot \frac{dH}{dt} \quad (2)$$

where V is the voltage across the sensor coil, u(H) is the permeability function of the material, and Dh/dt is the time derivative of the applied field. The constant $k_1$ is function of several physical parameters including the turn density of the coil and the volume of the core material. When the external field $H_E$ is constant (i.e. does not vary with time), equations (1) and (2) can be combined to produce the following:

$$V = k_0 k_1 u(H) \cdot \frac{dI}{dt} \quad (3)$$

With a normal inductor, the voltage is related to the time derivative of the current as follows:

$$V = L \cdot \frac{di}{dt} \quad (4)$$

Where L is defined to be the inductance of the inductor. By interpreting equation (3) in light of equation (4), the following term, $$L(H) = k_0 k_1 u(H) \quad (5)$$

can be termed the inductance of the non-linear sensor. Note that this is not constant but rather a function which is dependent on the field applied to the material.

In a simple L/R relaxation oscillator, such as the one shown in FIG. 1 with timing resistor 4 having a resistance R and sensor 3 having an inductance L, the oscillator period is proportional to the inductance of the inductor, assuming that the inductor is linear. With an oscillator implemented using an inverting Schmitt Trigger, the period will be:

$$t = (L/R) \ln \frac{V_H(V_S - V_L)}{V_L(V_S - V_H)} \qquad (6)$$

Where t is the oscillator period, L is the timing inductance and R is the timing resistance. The $V_L$ and $V_H$ constants refer to the low and high threshold voltages of the Schmitt trigger, and $V_s$ refers to the supply voltage for the oscillator. Equation (6) can be used as a very rough approximation to show that the period of the oscillator will be approximately proportional to the inductance of the sensor and thus proportional to its permeability. However, since the inductor is non-linear, the precise expression is a bit different, as discussed later. As the inductor oscillates, it presents a different inductance to the oscillator at different times during the cycle. The net period is a weighted average of the inductances across the entire cycle.

To ensure that the frequency of the oscillator is a quasi-linear function of the applied field, the oscillator must operate with a DC bias current through the sensor. Otherwise, if the oscillator operated with only an AC component of current flowing through the inductor, the oscillator period would be identical for fields of identical magnitude applied in opposite directions. This is due to the symmetry of the permeability curve (as can be seen in FIG. 3.) Fortunately, the Schmitt trigger implementation of the relaxation oscillator naturally produces a DC bias current through the inductor which breaks the symmetry. Essentially, the output voltage of the Schmitt-trigger affects the net DC bias current through the inductor, and the output voltage of the Schmitt-trigger switch affects the symmetry of the output waveform and thus controls the zero offset of the magnetometer.

Figure 2:
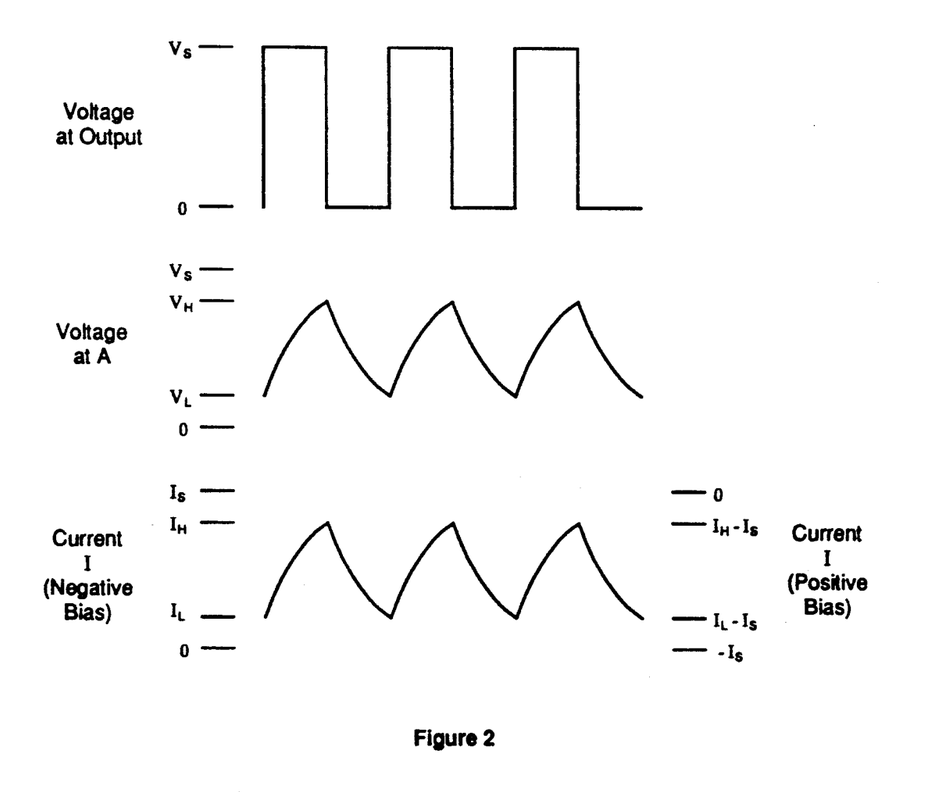
FIG. 2 shows the waveforms associated with the magnetometer of FIG. 1.

FIG. 1 shows a schematic for the relaxation oscillator of the magnetometer as mentioned earlier. For now, assume that the "Bias Polarity" input of switch 1 selects the low input, i.e. ground, then the output of the oscillator will be a square wave as shown in FIG. 2. (The Schmitt trigger and the buffer are intended to be CMOS; the outputs should swing close to the supply rails.) The voltage at node A will be as shown in FIG. 2, swinging between the Schmitt trigger threshold voltages $V_L$ and $V_H$ with an exponential sawtooth waveform. The current I through resistor R will follow the voltage at node A and will be as shown in the "Current I (Negative Bias)" portion of FIG. 2. The currents are defined as follows:

$$I_S = V_s/R \qquad (7)$$

$$I_L = V_L/R \qquad (8)$$

$$I_H = V_H/R \qquad (9)$$

where R is the timing resistance, $V_S$ is the supply voltage, and $V_L$ and $V_H$ are the low and high threshold voltages. Using the relationship of equation (1), the currents above will create corresponding fields in the inductor which will define be defined as follows:

$$H_S = k_0 I_S = k_0 V_S/R \qquad (10)$$

$$H_L = k_0 I_L = k_0 V_L/R \qquad (11)$$

$$H_H = k_0 I_H = k_0 V_H/R \qquad (12)$$

Figure 4:
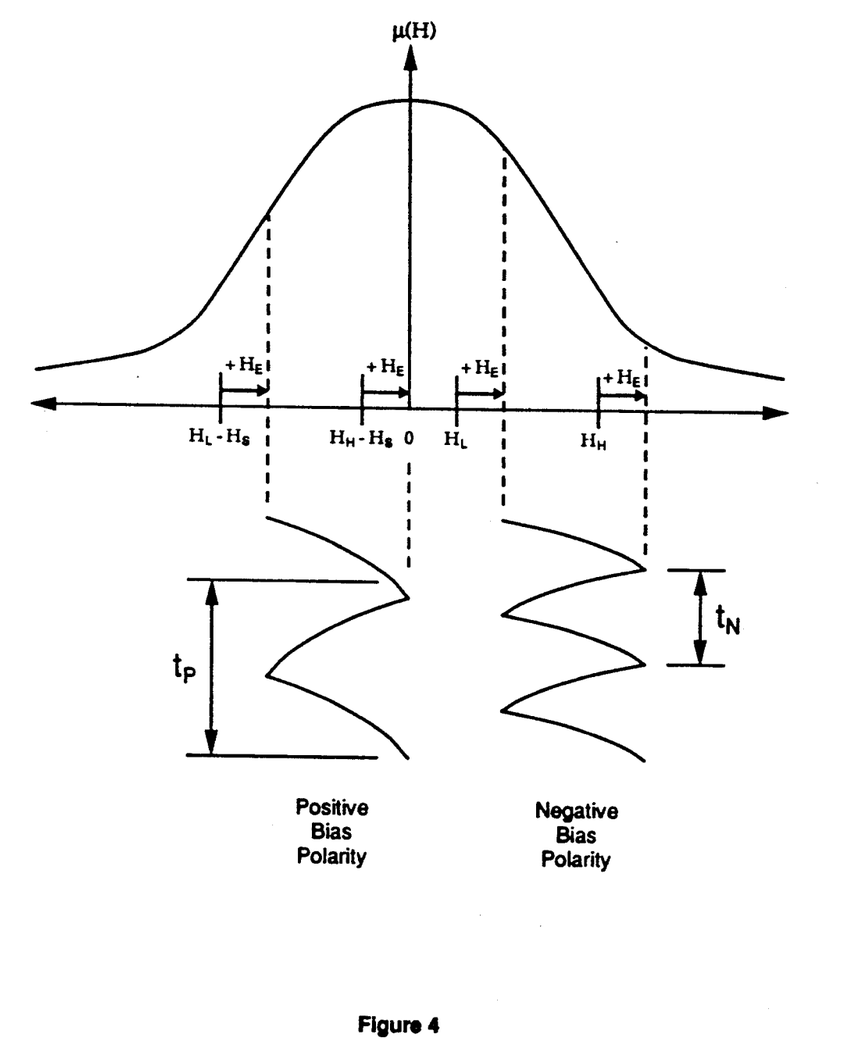
FIG. 4 shows waveforms associated with operating the magnetometer sensor of FIG. 1 with an applied external magnetic field.

It can be seen by looking at the right-hand waveform on the graph in FIG. 3 (the portion labeled "Negative Bias"), that the field applied to the inductor oscillates between $H_L$ and $H_H$. The particular permeability of the curve over that region gives the waveform a period $t_N$. In FIG. 4, the graph shows the effect when a positive external magnetic field $H_E$, is applied. The thresholds $H_L$ and $H_H$ are shifted by $H_E$ and the oscillator is now operating on a different part of the permeability curve where the average inductance is a bit less. As a consequence, the period of the oscillator, $t_N$, is shorter. The relationship between the applied field $H_E$, and the oscillator period $t_N$, is graphed in FIG. 5. The period will decrease for positive fields and increase with negative fields. (The scale of the $H_E$ axis is expanded compared to the scale of the H axes in FIGS. 3 and 4.)

Figure 5:
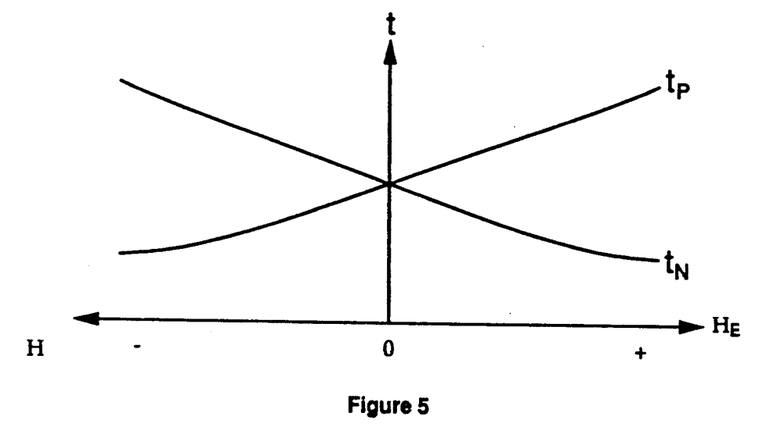
FIG. 5 shows a graph of the sensor period as a function of applied magnetic field for positive and negative biases for the magnetometer of FIG. 1.

In the graph of FIG. 5, notice that the period $t_N$ of the oscillator crosses the $H_E=0$ axis at an arbitrary period. To calculate the magnetic field with a sign, it is necessary to know this zero period. Unfortunately, with no applied field, the period of the magnetometer changes significantly over temperature. This is because the permeability of the material changes with temperature. Fortunately, the permeability curve will remain symmetric as follows:

$$u(H) = u(-H) \qquad (13)$$

Figure 6:
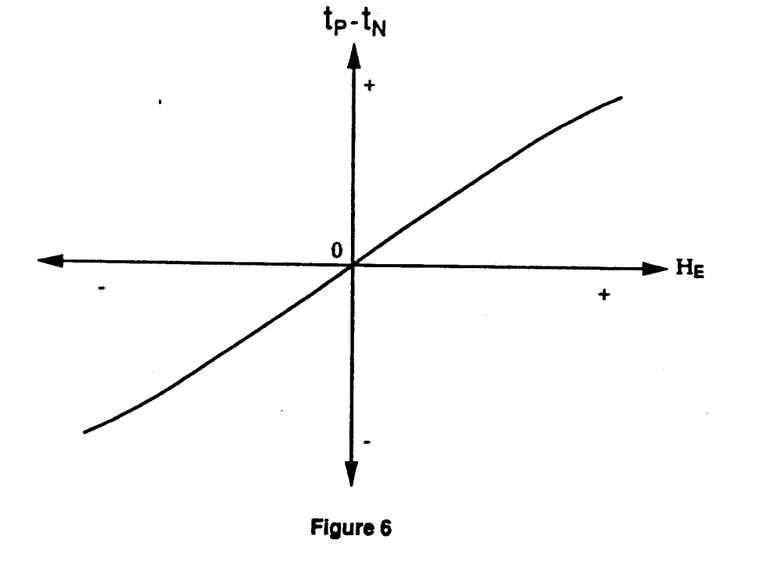
FIG. 6 shows a graph of zero-compensated sensor response as a function of applied magnetic field for the magnetometer of FIG. 1.

This symmetry in reflection will be true at all temperatures and true despite most sensor defects. So if the system is operated on the opposite side of the curve in a mirror image of the first side, it will be ensured that the period of the waveform will be identical to the first one when no external magnetic field is applied to the sensor. Additionally, when operating on the left side of the curve in FIGS. 3 and 4, the period can be seen to increase with the applied field. This period, $t_P$, is graphed against applied field in FIG. 5. By taking the difference of the periods from oscillating on opposite sides of the permeability curve, a zero-compensated reading can be obtained. This is shown in FIG. 6. This final result should theoretically have no zero offset over temperature or aging. Switching element 1 provides for this ability to operate on both sides of the permeability curve.

The alternating bias scheme explained above relies on the ability to operate on the opposite sides of the permeability curve in an exact mirror image. This means that the threshold fields $H_L$ and $H_H$ must satisfy the following relation:

$$H_L + H_H = H_S \qquad (14)$$

so that when the sensor is in the "positive" bias region, the $H_H-H_S$ threshold will equal $-H_L$ (see FIG. 3.) Similarly, the $H_L-H_S$ threshold should equal $-H_H$. By the relations shown above, if the threshold voltages of the Schmitt trigger in the circuit of FIG. 1 meet the following criterion:

$$V_L + V_H = V_S \qquad (15)$$

then the oscillator will provide the mirror-image bias polarity flipping required for the alternating bias scheme.

The bias polarity of the oscillator is controlled by the "Bias Polarity" input shown in FIG. 1. While the operation of the oscillator is almost identical irrespective of this input level, the net current through the timing resistor is altered. The differences between the current I for negative and positive bias polarities are shown in FIG. 2. (The current waveform in FIG. 2 is shared for both polarities but the labeling on either side reflects the distinctions.) While the waveforms are virtually identical (assuming no external applied field,) the current is "shifted" by an amount $I_S$. This shift can place the biasing in the opposite half of the curve by simply changing the level of the Bias Polarity input.

Figure 7:
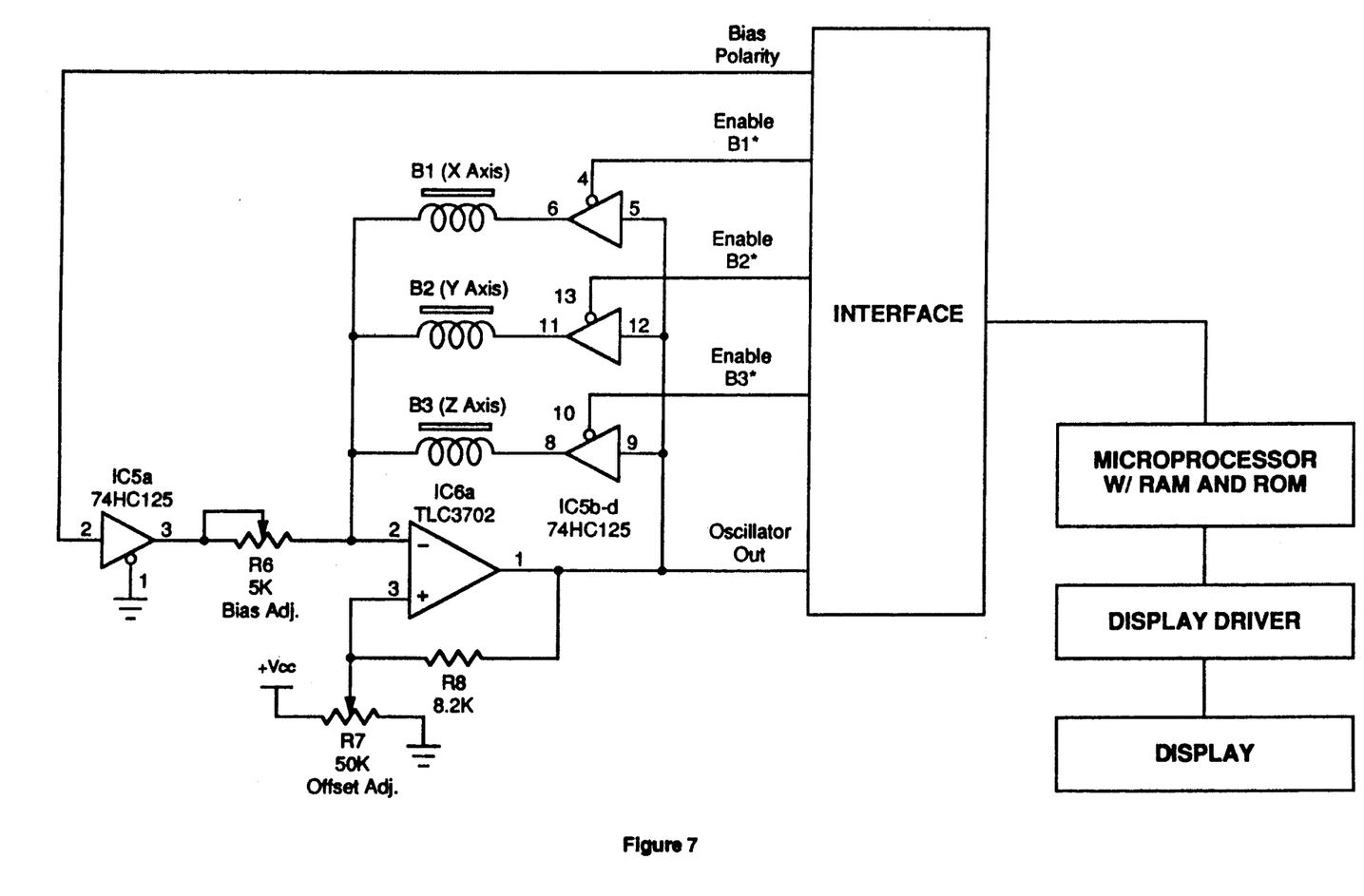
FIG. 7 shows the relaxation oscillator/sensor portion of a magnetometer as in FIG. 1 having sensors for all three axes.

In actual use, the magnetic field is measured by taking two readings, one positive and one negative, and subtracting the two resulting periods to obtain the final zero-compensated output. In the complete compass system, three of these sensors are used and the process must be done once for each axis. While the magnetometer could be implemented with three different oscillators of the type shown in FIG. 1, it is somewhat simpler to multiplex the three sensors onto one common oscillator. A schematic of this circuit is shown in FIG. 7. IC6a in the preferred mode is a TLC3702, which is a low power CMOS comparator used to implement the Schmitt trigger circuit. The magnetometer sensors are labeled B1, B2, and B3, and each has its own drive buffer, implemented as IC5b, IC5c, and IC5d, respectively. Each sensor drive buffer is enabled one at a time to take a reading for the respective sensor. Sensors with disabled drive buffers simply hang unconnected at the drive end and do not take part in the magnetometer sensing. IC5a is an input buffer. The bias polarity switching is accomplished via the microprocessor so as to sample both sides of the permeability curve for each sensor, just as was done for the sensor in the uniaxial case.

As mentioned earlier, the exact expression for the relationship between the oscillator period and an external applied field is more complex than a simple proportional relationship. Neglecting the effects of material hysteresis (which are quite small for amorphous metals), the periods of the oscillator for positive and negative biases can be expressed as integrals. The period with a positive bias polarity, tP can be expressed as a function of the applied external magnetic field $H_E$ as follows:

$$t_P(H_E) = \frac{(k_1 k_o)}{R} \int_{H_L}^{H_H} u(H + H_E)\left[\frac{1}{H_S - H} + \frac{1}{H}\right] dH \quad (16)$$

The period of the oscillator with a negative bias polarity, $t_N$, can similarly be expressed as a function of the applied external magnetic field $H_E$ as follows:

$$t_N(H_E) = \quad (17)$$

$$\frac{(k_1 k_o)}{R} \int_{H_S - H_H}^{H_S - H_L} u(H - H_E)\left[\frac{1}{H_S - H} + \frac{1}{H}\right] dH$$

where $k_1$ and $k_o$ are physical constants as explained for equations (1) and (2) and R is the resistance of the timing resistor. The constants $H_L$, $H_H$ and $H_S$ are as defined in equations (10) through (12) above. The permeability of the material versus the net applied field is u(H). The variable of integration is H.

With expressions (16) and (17) shown above, the validity of the zero-compensation scheme can be seen. When the external applied field is zero ($H_E=0$), and when the thresholds are symmetrical about the supply rails ($H_L+H_H=H_S$) the integrals for $t_P$ and $t_N$ will be identical and the difference between the positive and negative bias periods will be zero.

The integral expressions above can also be treated as convolution integrals to provide some intuitive understanding of the relationship of the core permeability with the output linearity.

Those skilled in the art will appreciate that the above embodiment could be implemented with other types of relaxation oscillators. Hence, this first embodiment is not restricted to use of a Schmitt-trigger, but rather the more general concept of the oscillator driver being an inverting gain element which has hysteresis. Further, those skilled in the art will appreciate that the embodiment of FIG. 1 could be implemented in a more general, visibly symmetric, fashion, i.e. switch 1 could be between symmetric voltages $+V_b$ and $-V_b$ and the bias points of the Schmitt-trigger between $+V_S$ and $-V_S$. In that dual-supply implementation, $V_s > V_H > V_L > -V_S$ and $V_L + V_H = 0$. Further, $V_b$ and the thresholds determine the extreme bias points while $V_S$ has an effect on the period.

Those skilled in the art will also appreciate that an important feature of the invention is the use of an L/R oscillator as opposed to an LC oscillator. For an L/R oscillator, the period is proportional to the inductance. However, for an LC oscillator the period is proportional to the square root of the inductance. As a consequence, a 1% change in the inductance will cause a 1% change in the period for the relaxation oscillator and only a 0.5% change for an LC oscillator. A smaller period or frequency variation will either means a sacrifice in resolution or sample time (assuming everything else remains constant). Sample time, in turn, affects the system power consumption, which for battery driven systems is of critical importance.

Split-Resistor Magnetometer Circuit

Although the above-described embodiment using bias polarity switching substantially addresses the zero-offset problem, it has been found in practice that the zero-offset is more sensitive to temperature variations than is generally desired when the magnetometer of this embodiment is used as the basis for an accurate digital compass. Furthermore, these variations with temperature have proven to be very intractable to eliminate.

Figure 8:
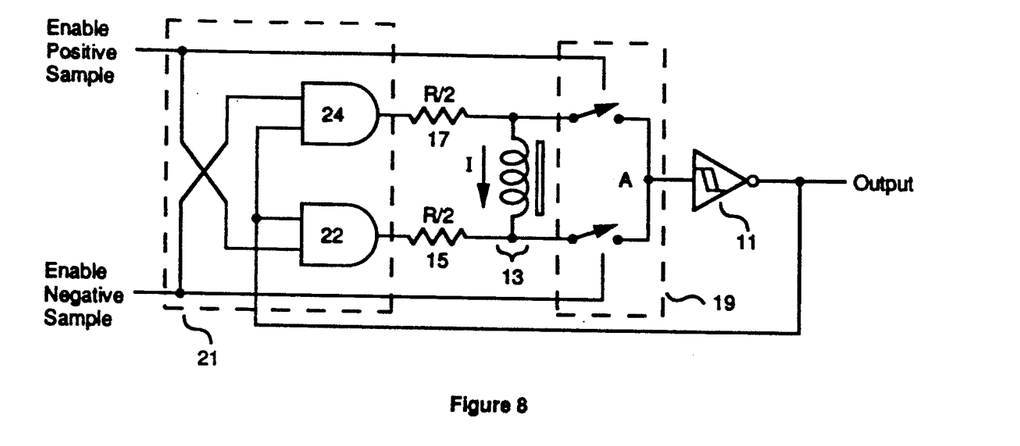
FIG. 8 shows a split-resistor magnetometer oscillator circuit according to the invention.
Figure 9:
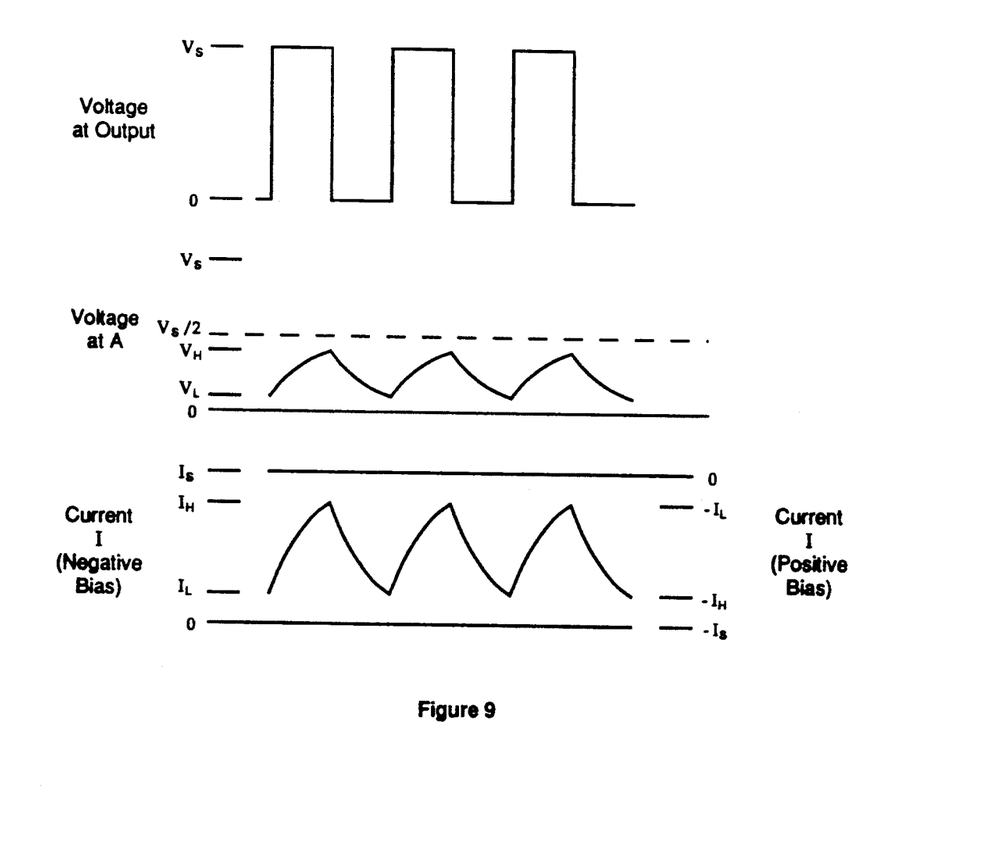
FIG. 9 shows the waveforms associated with the magnetometer oscillator of FIG. 8.
Figure 10:
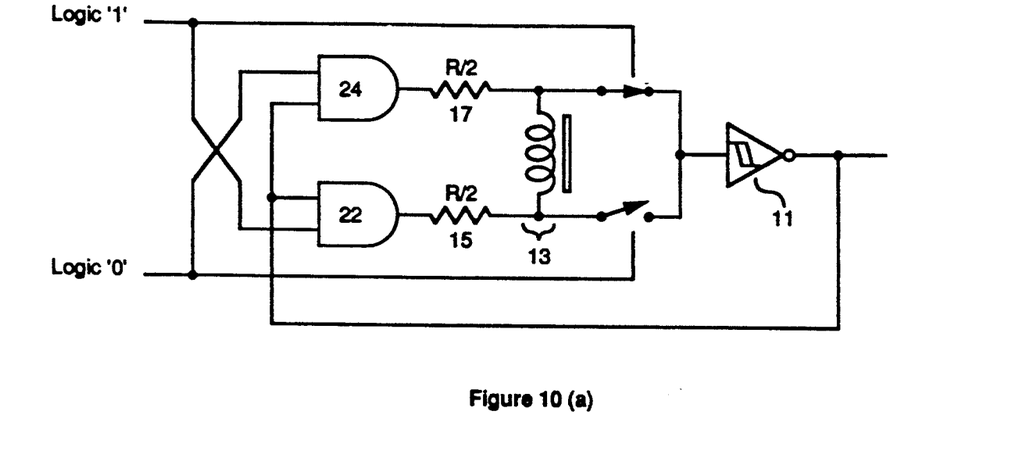
FIG. 10(a) shows the oscillator of FIG. 8 in one switch configuration.
FIGS. 10(b) and 10(c), show equivalent circuits for the oscillator in FIG. 10(a) in that switch configuration.

FIG. 10(a) shows a uniaxial magnetometer circuit that overcomes the zero-offset problem and its temperature variations by virtue of its topology. The circuit includes a Schmitt-trigger 11, an inductive sensor 13 (which in the preferred mode consists of a wire-wound high permeability magnetic core as in the first embodiment), two impedance matched timing resistors 15 and 17, a switching element 19, and a gating element 21 made up of AND-gates 22 and 24. In this preferred embodiment of the invention, the timing resistor as described in the theoretical discussion above is effectively split into two equal halves that provide two different nodes at which to measure the current through the sensor inductor 13. This provides the sensor with positive and negative biases that are much better matched in practice than heretofore has been achieved. For proper operation, the Schmitt-trigger should have thresholds that are both less than half of the supply voltage $V_S$. Also, in the preferred mode, the AND-gates 22 and 24 should have low impedance outputs that can swing from rail to rail (like CMOS outputs). The waveforms for the circuit of FIG. 8 are shown in FIG. 9.

The operation of the circuit can be understood by simplifying the circuit and illustrating its equivalence to the basic Schmitt Trigger oscillator. In FIG. 10a, the Split-Resistor Oscillator is shown with an active enable input. This logic high input to the corresponding (lower) AND gate effectively enables the output of the Schmitt Trigger onto the lower of the two resistors. The disabled upper AND gate effectively grounds the end of the other resistor. The enabled analog switch creates a closed signal path from the inductor end to the Schmitt Trigger input. This simplification is shown in FIG. 10b. Given the symmetry of the circuit, it can be observed that case with the opposite enable input active yields the same equivalent circuit, except that the inductor itself is "flipped". This, in combination with the inherent DC bias of the Schmitt Trigger circuit, gives a mechanism to bias the inductor uniformly in both directions. If the circuit of FIG. 10b is redrawn, the circuit of FIG. 10c results. This is very similar to the original Schmitt trigger oscillator. The total timing resistor is $R/2+R/2=R$, but the resistor is tapped so that the Schmitt trigger sees a voltage that is half of that found in the original circuit. Thus the Schmitt trigger thresholds are halved to compensate for this effect.

Figure 11A:
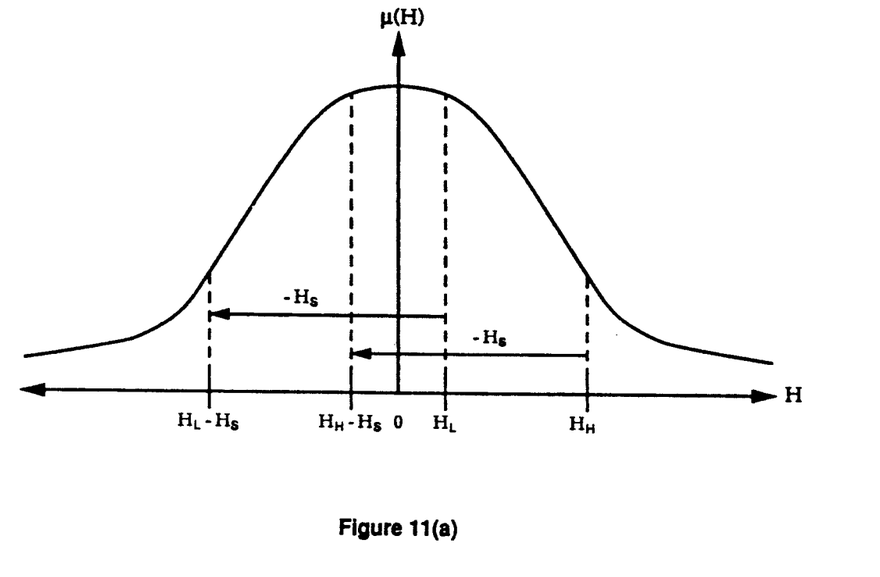
FIG. 11(a) shows the threshold shift associated with the circuit of FIG. 1.
Figure 11B:
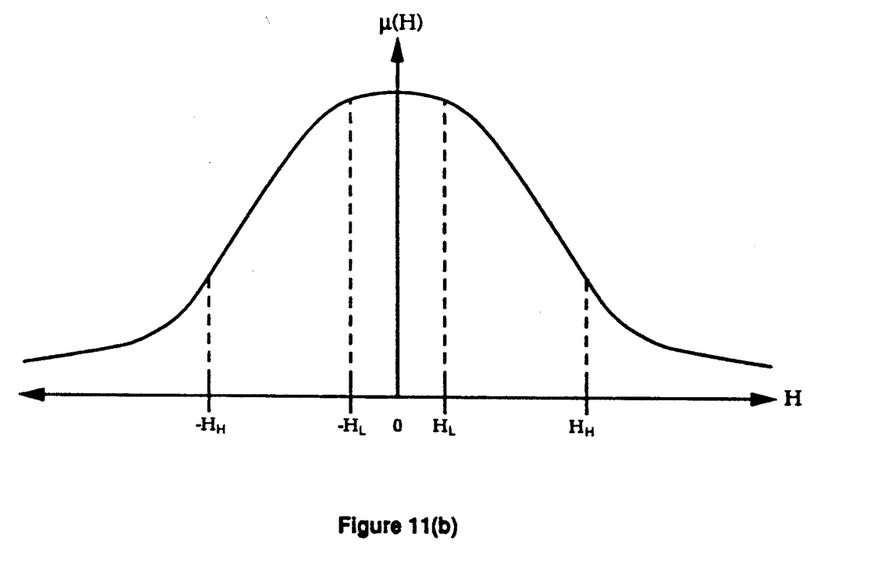
FIG. 11(b) shows the threshold conditions for the magnetometer circuit according to the invention.

The general advantage of the Split-Resistor topology is that zero offset is no longer sensitive to Schmitt trigger characteristics. The inductor experiences a uniform propagation delay with either bias polarity. Also, the thresholds no longer have to meet the $V_L+V_H=V_S$ symmetry requirement. The effect of threshold asymmetry is illustrated in FIG. 11a. The thresholds for the Split-Resistor oscillator are shown in FIG. 11b. The only circuit parameters that have a significant effect on the zero offset are the matching of the split resistors, and the matching of the output buffer resistances. The latter requirement is somewhat relaxed though, in that the output resistance to the positive supply doesn't have to match the output resistance to ground; only the respective resistances have to be matched between the two AND buffers.

The analytic treatment for the Split-Resistor circuit is slightly different. The convolution equations for the period of the sensor are similar.

The period with a positive bias polarity, $t_P$ is identically:

$$t_P(H_E) = \frac{(k_1 k_o)}{R} \int_{H_L}^{H_H} u(H + H_E)\left[\frac{1}{H_S - H} + \frac{1}{H}\right]dH \quad (18)$$

The period of the oscillator with a negative bias polarity $t_N$ however is:

$$t_P(H_E) = \frac{(k_1 k_o)}{R} \int_{H_L}^{H_H} u(H - H_E)\left[\frac{1}{H_S - H} + \frac{1}{H}\right]dH \quad (19)$$

Figure 12:
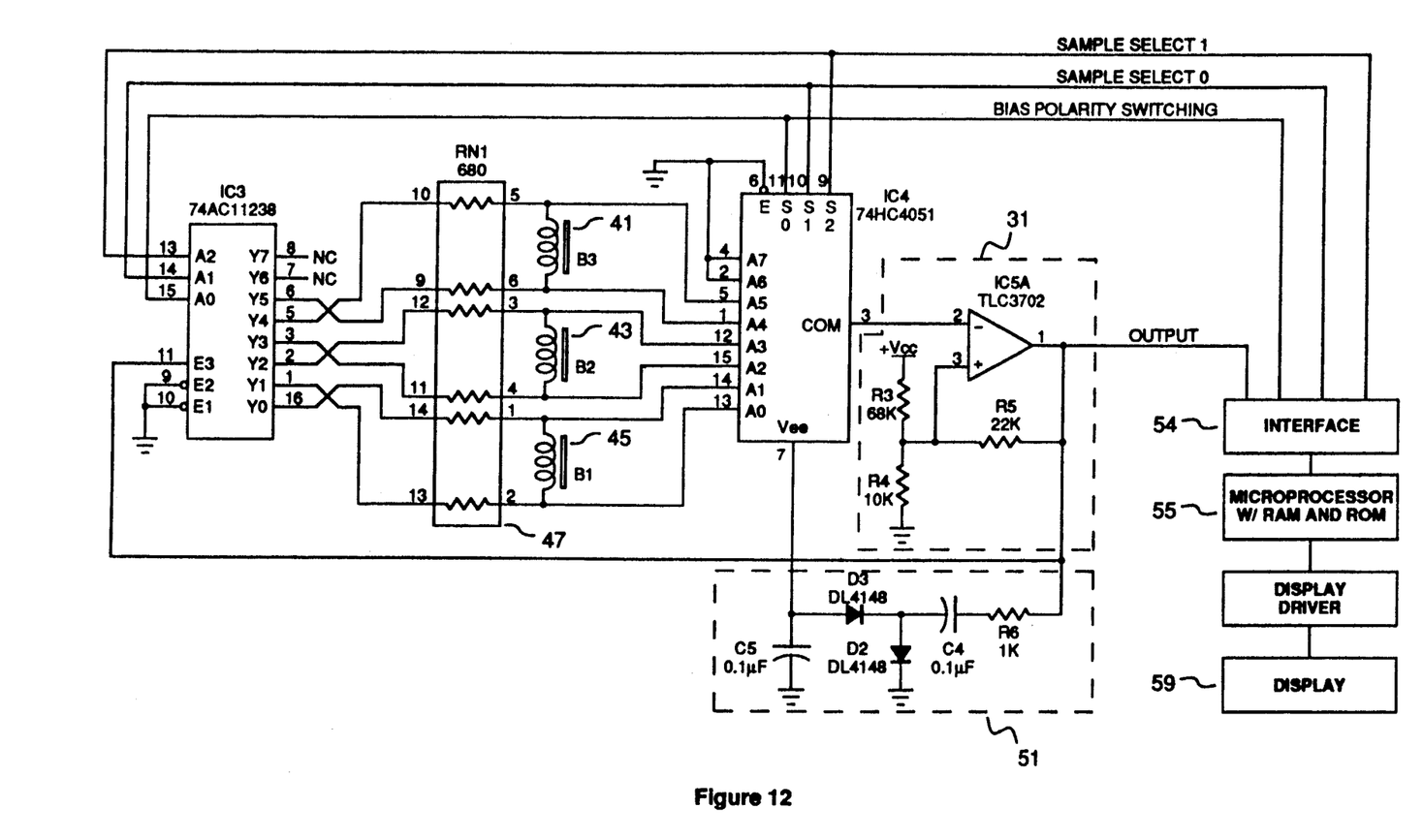
FIG. 12 shows a detailed schematic of a magnetometer circuit according to the invention which is tri-axial.

FIG. 12 shows an actual implementation of the split-resistor circuitry for a tri-axial magnetometer system according to a preferred embodiment of the invention.

A Schmitt-trigger 31 is shared among three inductive sensors 41, 43, and 45, which are again wire-wound high permeability magnetic cores as described earlier. A gating element IC3 provides the gating/demultiplexing function that is performed by AND-gates 22 and 24 in the previous embodiment. In this embodiment IC3 is implemented using a 1 to 8 demultiplexer, such as a 74AC11238. The switching function is implemented by IC4 using an 8 to 1 analog multiplexer such as a 74HC4051. Since matching is important, the timing resistors are a part of common resistor network 47. While most of the circuitry operates off of a single 5 V supply, the multiplexer IC4 uses a negative supply voltage of less than $-2.5$ V to accommodate the negative input from the unselected side of an oscillating sensor inductor. The diode/capacitor network 51 forms a voltage invertor to provide this voltage.

The analytical/mathematical functions and the sample select functions necessary to obtain meaningful information from the Split-Resistor Oscillator circuitry are performed by a microprocessor 55, which is connected to the Oscillator via an appropriate interface 54. Once the measurements are complete, the microprocessor then provides appropriate signals to display 59 via the display driver to display the magnetic field information derived from the measurement process.

I claim:

1. A magnetometer for measuring an external magnetic field, comprising:
    a relaxation oscillator circuit comprising:
        driver means having an input terminal and an output terminal for providing an oscillating signal at said output terminal;
        sensor means having a first coil wound on a first high magnetic permeability core for controlling the period of said oscillator circuit, said first coil having first and second first-coil terminals, and said first coil being electrically symmetric between said first and second first-coil terminals;
        a first first-coil resistor coupled to said first first-coil terminal;
        a second first-coil resistor coupled to said second first-coil terminal, said second first-coil resistor and said first first-coil resistor being impedance matched;
        switching means coupled to said first and second first-coil terminals and to said input terminal of said driver means for coupling said input terminal alternately to said first first-coil terminal and to said second first-coil terminal; and
        gate means coupled to said first first-coil resistor and to said second first-coil resistor for shunting said first first-coil resistor to a DC potential when said switching means couples said input terminal of said driver means to said second first-coil terminal, and for shunting said second first-coil resistor to said DC potential when said switching means couples said input terminal of said driver means to said first first-coil terminal;
    measurement means for analyzing the output signal from said output terminal of said driver means, and for providing a signal representing the magnitude of said external magnetic field strength.

2. A magnetometer as in claim 1 wherein said driver means comprises an inverting gain element having hysteresis.

3. A magnetometer as in claim 1 wherein said driver means comprises a Schmitt-trigger.

4. A magnetometer as in claim 1 wherein said sensor means comprises a second coil wound on a second high permeability magnetic core, said second coil having first and second second-coil terminals, and said second coil being electrically symmetric between said first and second second-coil terminals;

and wherein said magnetometer further comprises:
a first second-coil resistor coupled to said first second-coil terminal;
a second second-coil resistor coupled to said first second-coil terminal, said second second-coil resister and said first second-coil resister being impedance matched;
and wherein said switching means is coupled to said first and second second-coil terminals and to said input terminal of said driver means for coupling said input terminal alternately to said first second-coil terminal and to said second second-coil terminal;
and wherein said gate means is also coupled to said first second-coil resistor and to said second second-coil resistor for shunting said first second-coil resistor to a DC potential when said switching means couples said input terminal of said driver means to said second second terminal, and for shunting said second second-coil resistor to said DC potential when said switching means couples said input terminal of said driver means to said first second-coil terminal.

5. A magnetometer as in claim 4 wherein said sensor means comprises a third coil wound on a third high permeability magnetic core, said third coil having first and second third-coil terminals, and said third coil being electrically symmetric between said first and second third-coil terminals;

and wherein said magnetometer further comprises:
a first third-coil resistor coupled to said first third-coil terminal;
a second third-coil resistor coupled to said first third-coil terminal, said second third-coil resister and said first third-coil resister being impedance matched;
and wherein said switching means is coupled to said first and second third-coil terminals and to said input terminal of said driver means for coupling said input terminal alternately to said first third-coil terminal and to said second third-coil terminal;
and wherein said gate means is also coupled to said first third-coil resistor and to said second third-coil resistor for shunting said first third-coil resistor to a DC potential when said switching means couples said input terminal of said driver means to said second third-coil terminal, and for shunting said second third-coil resistor to said DC potential when said switching means couples said input terminal of said driver, means to said first third-coil terminal.

6. A relaxation oscillator circuit useful in a magnetometer comprising:
driver means having an input terminal and an output terminal for providing an oscillating signal at said output terminal;
sensor means having a first coil wound on a firs thigh magnetic permeability core for controlling the period of said oscillator circuit, said first coil having first and second first-coil terminals, and said first coil being electrically symmetric between said first and second first-coil terminals;
a first first-coil resistor coupled to said first first-coil terminal;
a second first-coil resistor coupled to said second first-coil terminal, said second first-coil resistor and said first first-coil resistor being impedance matched;
switching means coupled to said first and second first-coil terminals and to said input terminal of said driver means for coupling said input terminal alternately to said first first-coil terminal and to said second first-col terminal;
gate means coupled to said first first-col resistor and to said second first-coil resistor for shunting said first first-coil resistor to ground when said switching means couples said input terminal of said driver means to said second first-coil terminal, and for shunting said second first-coil resistor to ground when said switching means couples said input terminal of said driver means to said first first-coil terminal.

7. An oscillator circuit as in claim 6 wherein said driver means comprises an inverting gain element having hysteresis.

8. An oscillator circuit as in claim 6 wherein said driver means comprises a Schmitt-trigger.

9. A magnetometer for measuring an external magnetic field, comprising:
a relaxation oscillator circuit comprising:
Schmitt-trigger means having an input terminal and an output terminal for providing an oscillating signal at said output terminal, said Schmitt-trigger means having symmetrical thresholds;
sensor means having a first coil wound on a first high magnetic permeability core for controlling the period of said oscillator circuit, said first coil having first and second first-coil terminals, and said first coil being electrically symmetric between said first and second first-coil terminals, said sensor means being coupled between the input terminal and the output terminal of said Schmitt-trigger means;
timing resistance means coupled to said input terminal of said Schmitt-trigger means; and
bias polarity switching means coupled to said timing resistance means opposite said input terminal to said Schmitt-trigger means, said bias polarity switching means for switching the bias polarity of said Schmitt-trigger means;
measurement means for analyzing the output signal from said output terminal of said Schmitt-trigger means, and for providing a signal representing the magnitude of said external magnetic field strength.

10. A relaxation oscillator circuit comprising:
Schmitt-trigger means having an input terminal and an output terminal for providing an oscillating signal at said output terminal, said Schmitt-trigger means having symmetrical thresholds;
sensor means having a first coil wound on a first high magnetic permeability core for controlling the period of said oscillator circuit, said first coil having first and second first-coil terminals, and said first coil being electrically symmetric between said first and second first-coil terminals, said sensor means being coupled between the input terminal and the output terminal of said Schmitt-trigger means;

timing resistance means coupled to said input terminal of said Schmitt-trigger means; and bias polarity switching means coupled to said timing resistance means opposite said input terminal to said Schmitt-trigger means, said bias polarity switching means for switching the bias polarity of said Schmitt-trigger means.

* * * * *